United States Patent [19]

Gotman

[11] 4,390,172
[45] Jun. 28, 1983

[54] PRECISE QUICK-RELEASE POSITIONING MECHANISM

[75] Inventor: Alexander Gotman, Santa Monica, Calif.

[73] Assignee: Presco, Inc., Irvine, Calif.

[21] Appl. No.: 211,105

[22] Filed: Nov. 28, 1980

[51] Int. Cl.³ .............................................. B23Q 1/06
[52] U.S. Cl. ........................................ 269/56; 29/464; 29/559; 29/563; 29/33 P; 33/180 R; 198/345; 269/309
[58] Field of Search ............... 29/559, 563, 464, 33 P; 33/180 R; 198/345; 269/56, 309, 310

[56] References Cited

U.S. PATENT DOCUMENTS

| 227,252 | 4/1880 | Hodges | 269/310 X |
|---|---|---|---|
| 1,489,933 | 4/1924 | Duffy | 269/309 X |
| 2,249,230 | 7/1941 | Schafer | 29/563 X |
| 2,819,784 | 1/1958 | Brown, Jr. | 269/309 X |
| 2,968,872 | 1/1961 | Welles | 33/180 R |
| 3,175,820 | 3/1965 | Schiler | 269/309 X |
| 3,540,318 | 11/1970 | Greenberg | 269/56 X |
| 3,793,738 | 2/1974 | Blakey | 33/180 R |
| 4,185,812 | 1/1980 | Hall | 269/56 |
| 4,239,445 | 12/1980 | Ozawa | 269/56 X |
| 4,331,229 | 5/1982 | Kamm | 198/345 |

FOREIGN PATENT DOCUMENTS 1238521  7/1971  United Kingdom ............... 269/309

Primary Examiner—Charlie T. Moon
Attorney, Agent, or Firm—Gene W. Arant

[57] ABSTRACT

A mechanism for quickly and precisely positioning one body relative to another body, which relies upon three support points between the two bodies. At a first point a hemispherical surface is received in an opening having the form of a trihedral pyramid. At a second support point a hemispherical surface is received in an opening having the form of a diahedral prism. At the third support point a rigid sphere held in loose confinement engages a flat surface.

14 Claims, 20 Drawing Figures

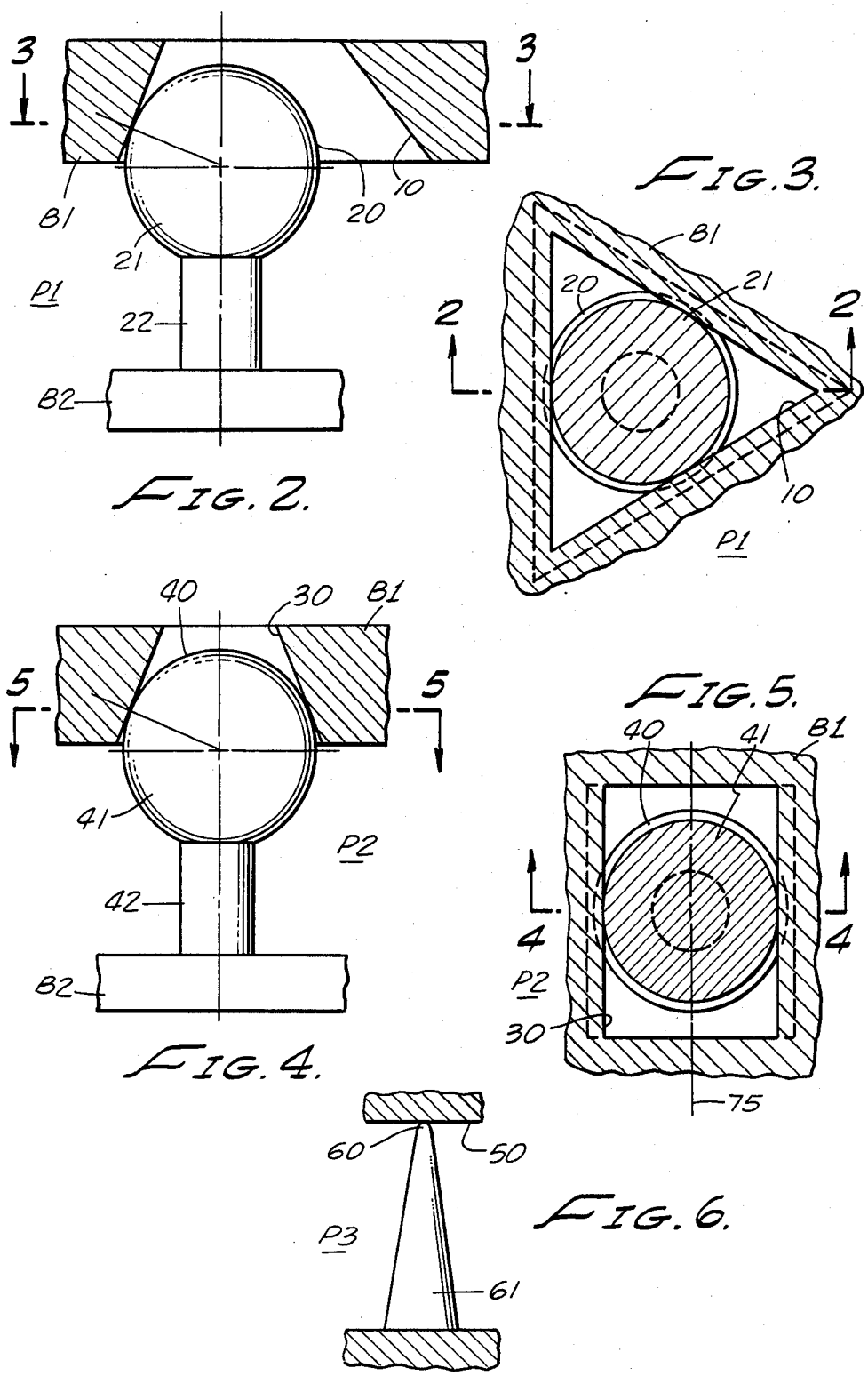

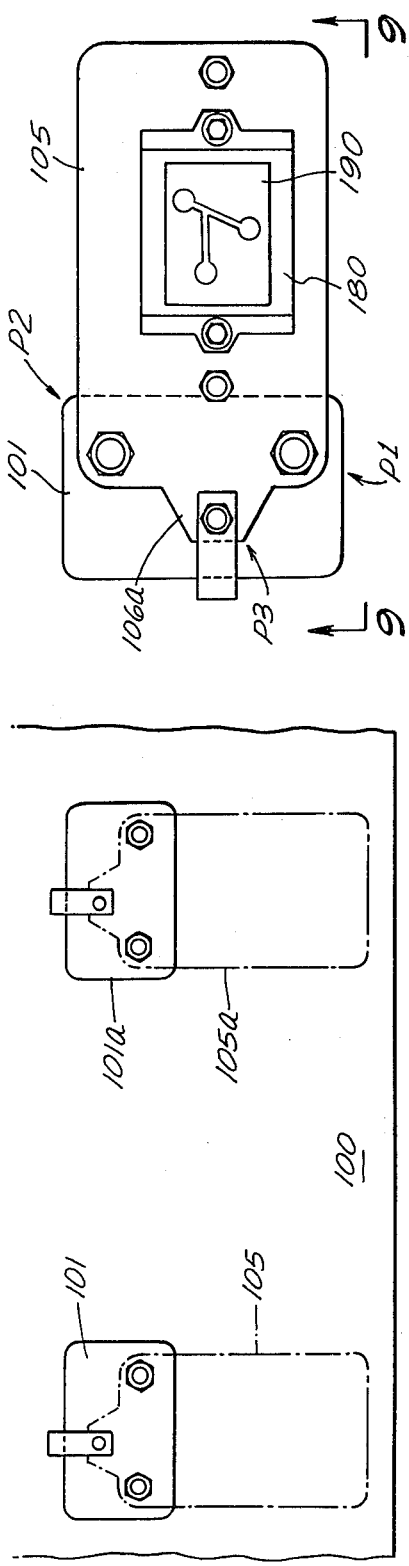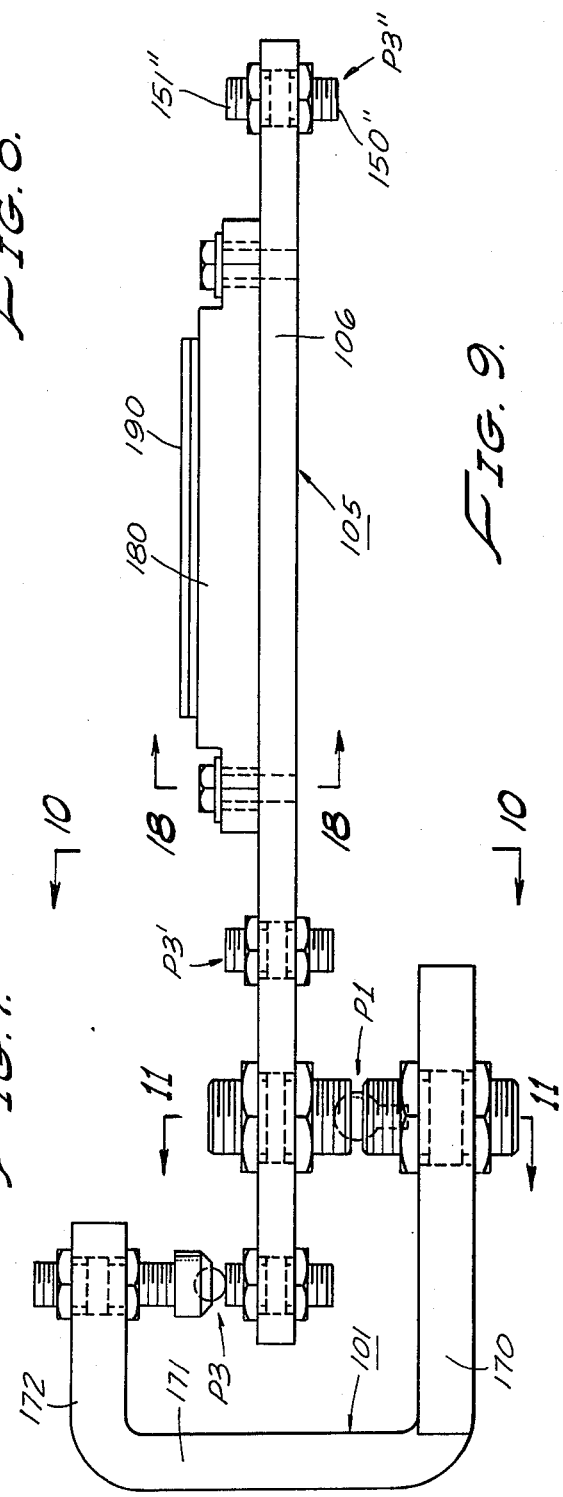

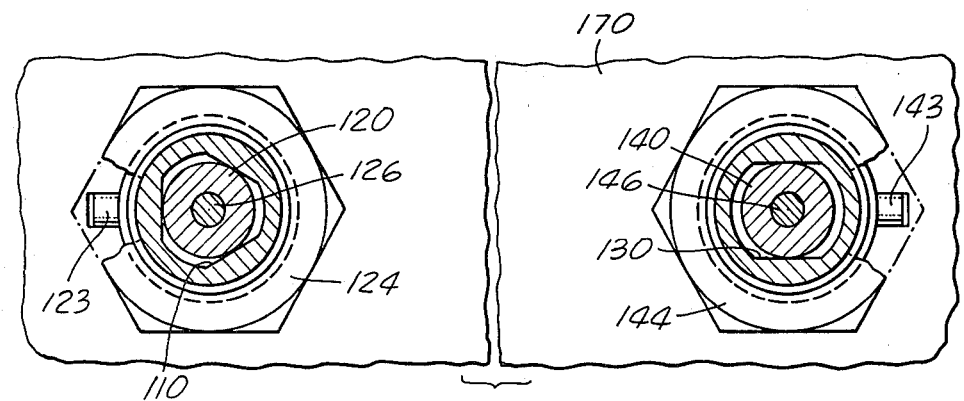
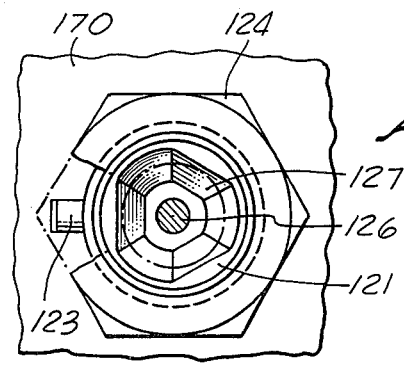
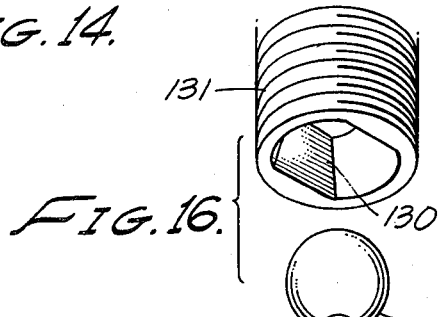
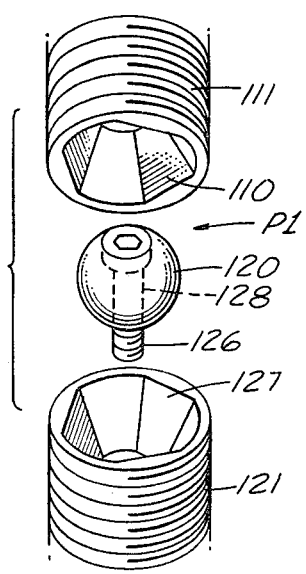
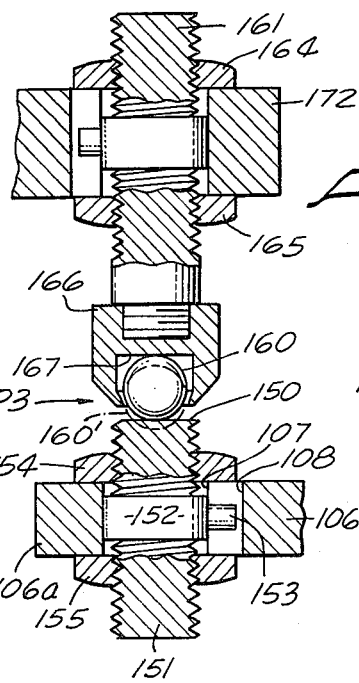
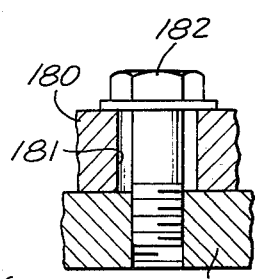

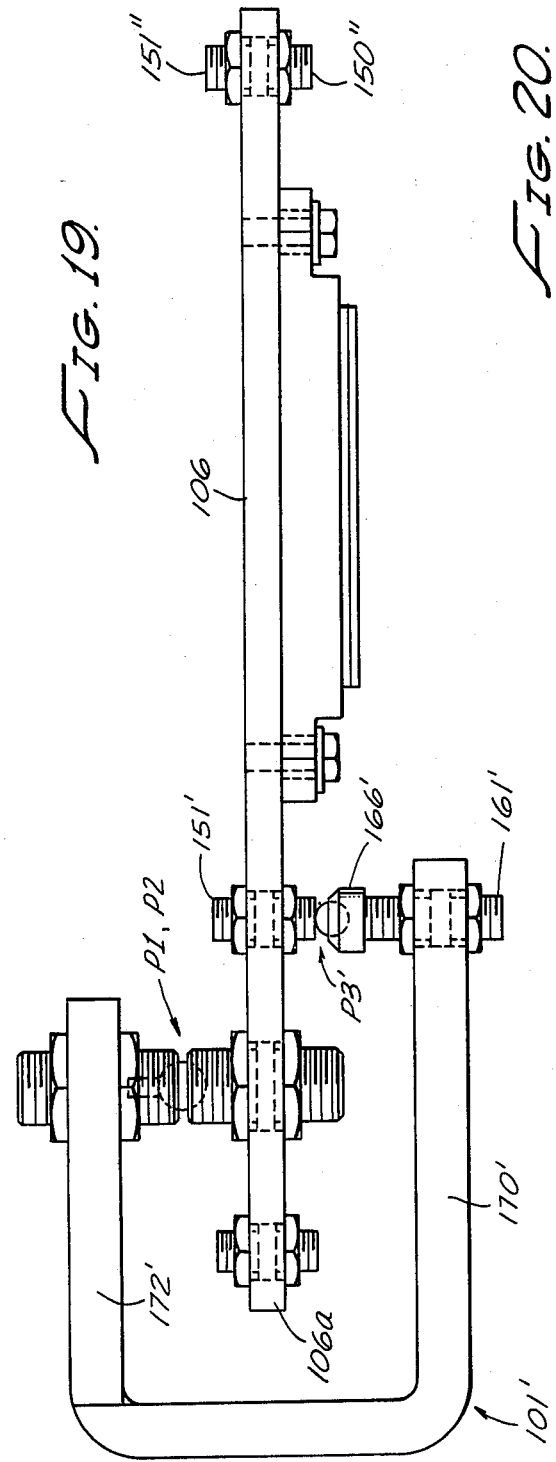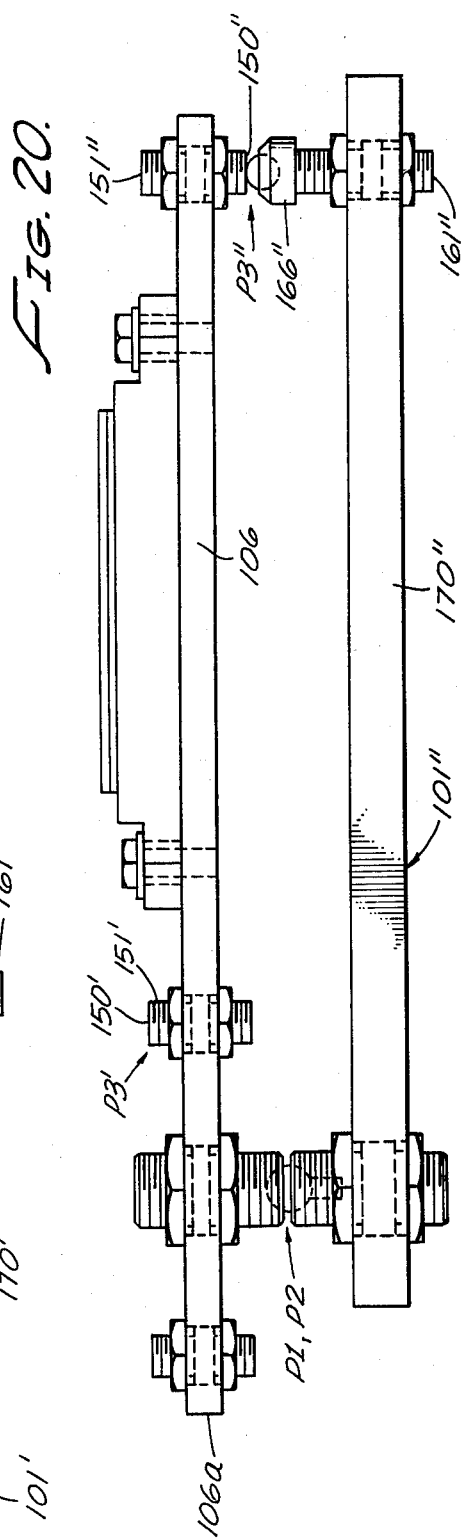

PRECISE QUICK-RELEASE POSITIONING MECHANISM

BACKGROUND OF THE INVENTION

There are many different situations in which it is necessary to position a body or object in a precisely determined three-dimensional relationship to another body or object. The present invention relates to a positioning mechanism in which two bodies may be quickly and easily secured together in a predetermined spatial relationship to each other, and may then be as quickly and easily separated.

In performing production processes, for example, it is often necessary to position a work piece in a precise spatial relationship to a machine or work station. The time element is important in production processes, and hence it is advantageous to employ mechanisms that can be quickly attached or detached.

A particular production technology in which the precise positioning of parts is very critical to success is in the manufacture of microelectronic circuits. In that industry it is the established practice to initially prepare a substrate of semiconductor material, and then perform a series of photolithographic and other operations upon the substrate in order to create a number of electronic circuits or "chips", as they are commonly called in the industry.

The substrate is initially in the form of a thin, flat sheet or wafer of material. It is moved through a series of work stations where a corresponding series of measurement, photolithographic, and other steps are performed on it. Then the completed product is cut into a number of "chips". The substrate or wafer may initially have a maximum dimension of several inches, which each individual "chip" cut from the substrate may have a maximum dimension of less than one inch. Since each "chip" may carry hundreds or even thousands of individual electronic circuit elements, it is readily apparent that the physical, chemical, and photographic procedures utilized in building up the structure of the "chip" must have the greatest precision as to dimensions and tolerances that can possibly be obtained.

PRIOR ART

The most pertinent prior art known to applicant and his attorney are the applicant's own Russian patent and publication. The inventor's certificate No. 1890907 was issued Sept. 16, 1966. The article was published in the magazine Electronic Technique, 1974, in Volume III, Microtechnique, at pages 153-162.

SUMMARY OF THE INVENTION

According to the present invention two rigid bodies are supported relative to each other at three separate support points. Interengaging parts of the two bodies at a first support point restrict three degrees of freedom of movement; at a second support point the interengaging parts restrict two degrees of freedom; and at the third support point one degree of freedom is restricted.

More specifically, at the first support point a hemisphere carried by one of the rigid bodies is inserted within an exposed opening in the other body having the form of a trihedral pyramid, such that the curved surface of the hemisphere engages all three plane surfaces of the opening. At a second support point another hemisphere is inserted into an opening having the form of a dihedral prism such that the curved surface of the hemisphere engages both flat surfaces of the opening. And at the third support point a protrusion on one body engages a flat surface on the other body.

According to the preferred practice of the invention the positioning means are also employed as supporting means. That is, one rigid body is supported above the other, by force of gravity, on the same three support points that determine the relative positions of the two bodies.

In its presently preferred application to production processes, the QUICK-RELEASE POSITIONING MECHANISM of the present invention has other preferred characteristics. One rigid body is preferably a receiver station mounted on a fixed base. The other rigid body is preferably a removable work carrier that may be supported upon the receiver station in a precisely predetermined spatial relationship relative thereto. It is then preferred that all of the interengaging parts that protrude outward are permanently incorporated as part of the receiver station. That is, the receiver station carries the hemispheres for the first and second support points, as well as the protrusion for the third support point. The removable work carrier is then devoid of protruding parts of the positioning mechanism but does contain exposed openings for the first and second support points and a flat surface for the third support point. This arrangement of the parts facilitates movement of the work carrier from one receiver station to the next as production work is accomplished in accordance with a production process.

Still more specifically, a receiver station in accordance with the invention also includes means for adjusting the position of the mating parts of the positioning mechanism which it carries. In similar fashion the mating parts of the positioning mechanism carried by the work carrier may also be adjusted relative to the work carrier. These adjustments make possible a range of selections of the desired position which the work carrier shall occupy relative to the receiver station.

Another feature of the invention is the provision of other specific mechanical features of the mating parts of the support points which improve the precision and reliability of the positioning action.

Yet another novel feature of the invention, in its application to the production of microelectronic circuits, is the provision of a work holder mounted upon the work carrier, and means for adjusting the position of the holder in two dimensions relative to the carrier.

The present invention also provides a novel production process wherein a work piece has a series of production steps performed on it, each of which requires precise alignment. By utilizing a series of work stations, each of which is aligned in advance, the work piece can then be advanced through the work stations without any additional alignment procedures being required. More specifically, each work station includes a receiver station having alignment means, and the alignment means of all receiver stations are identical. Each work station also includes a tool or device that is aligned in a predetermined relationship to the alignment means of the associated receiver. The work piece is secured to a work carrier which in turn is adapted to be removably attached to each successive receiver in a relative position determined by the alignment means of the receiver. When the work piece and/or its work carrier is correctly aligned for the first work station it then follows

DRAWING SUMMARY

FIGS. 2 and 3 are cross-sectional views illustrating the interfitting parts at a first one of the support points;

FIGS. 4 and 5 are cross-sectional views illustrating the interfitting parts at the second support point;

FIG. 6 is a cross-sectional view illustrating the interfitting parts at the third support point;

FIG. 7 is a top plan view of a factory layout for producing microminiature electronic circuits, including a plurality of work stations constructed in accordance with the invention;

FIG. 8 is an enlarged plan view of an individual work station of FIG. 7;

FIG. 9 is a side elevation view of the work station of FIG. 8 which includes both a receiver station and a removable work carrier;

FIG. 13 is a cross-sectional plan view of both the first and second support points taken on line 13—13 of FIG. 11;

FIG. 14 is a cross-sectional plan view of the first support point taken on line 14—14 of FIG. 11;

FIG. 15 is an exploded perspective view of the interfitting parts of the first support point;

FIG. 16 is an exploded perspective view of the interfitting parts of the second support point;

FIG. 17 is an elevation view, partially in cross-section, of the third support point, taken on line 17—17 of FIG. 10;

FIG. 18 is a detail of the work holder taken on line 18—18 of FIG. 9;

FIG. 19 is a side elevation view of a modified work station including the same work holder as FIG. 9 but a modified form of the receiver station; and FIG. 20 is another modified work station utilizing the same work holder but with still another form of the receiver station.

GENERAL CONCEPT

(FIGS. 1-6)

Reference is now made to FIGS. 1-6, inclusive, of the drawings which illustrate the general concept of the apparatus of the present invention.

Figure 1:
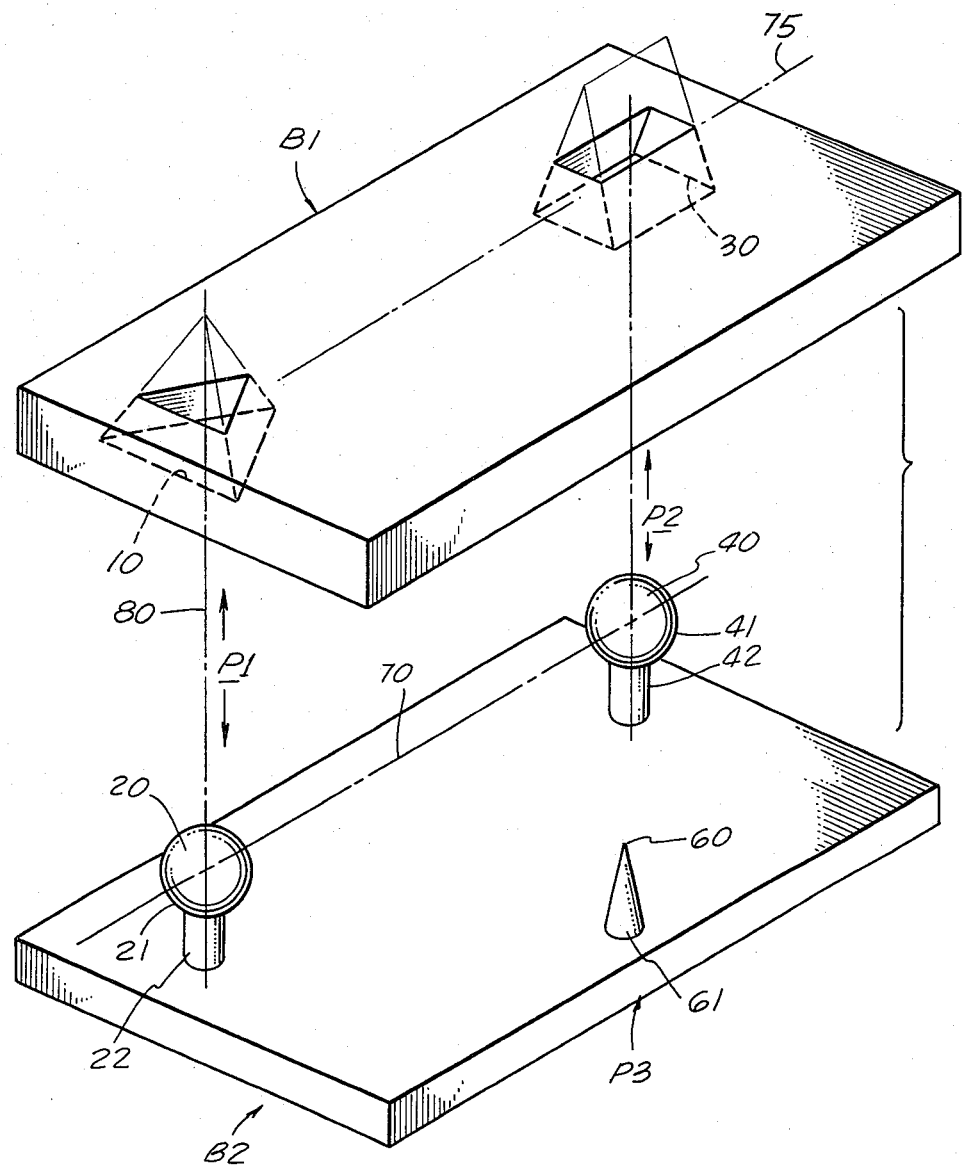
FIG. 1 is a schematic drawing illustrating two rigid bodies secured at three support points in accordance with the general concept of the invention.

As shown in FIG. 1, rigid bodies B1 and B2 are adapted to be secured together at three support points. For ease of illustration each of the rigid bodies is shown essentially in the form of a flat plate.

The upper rigid body B1 has an exposed opening 10 on its underside. The opening 10 is in the form of a trihedral pyramid whose widest dimension is at its open or lower end. The upper end of the pyramid is truncated.

The upper rigid body also has on its lower side a second exposed opening 30. The opening 30 is in the form of a dihedral prism which has its widest dimension at its open or lower end. The upper end of the prism is truncated.

Also of importance in the upper rigid body is a flat surface portion 50 which is best seen in FIG. 6. The flat surface 50 is laterally displaced from a common axis that might pass through the actual or approximate centers of the openings 10, 30.

A rigid hemisphere 20 projects above the upper surface of the lower rigid body B2. The hemispherical surface is actually part of a complete sphere 21 that is rigidly attached to the upper end of a short post 22 whose lower end is in turn rigidly attached to the upper face of the flat plate. The particular attachment means is illustrated only for reasons of convenience, since it is only the protruding hemispherical upper surface that operates to carry out the purposes of the invention.

A second hemispherical surface 40 also protrudes above the upper surface of the lower rigid body. Again, for convenience in illustration, this hemispherical surface is part of a complete sphere 41 that is attached by means of a post 42 to the plate B2.

Also attached to the upper surface of rigid body B2 is a substantially conical body 60 having a convexly curved upper end surface 60. See FIG. 6.

As will be apparent from the drawings, the upper rigid body B1 is adapted to rest upon the lower rigid body B2 in supporting engagement therewith. Hemispherical surface 20 enters trihedral pyramid 10 forming a first support point P1. Hemispherical surface 40 enters the dihedral prism 30 forming a second support point P2. And curved surface 60 engages the flat surface 50 forming a third support point P3.

While FIG. 1 shows the two rigid bodies B1 and B2 in separated relationship, FIGS. 2-6 show the positions of the mating parts of the three support points when the two bodies are secured together. Thus, FIGS. 2 and 3 show the interengaged relationship of the mating parts 10, 20 of the first support point P1. FIG. 2 is indicated as a cross section taken on FIG. 3, while FIG. 3 is indicated as a cross section taken on FIG. 2.

Mechanical details of support point P1 are illustrated in FIGS. 2 and 3. As shown in FIG. 2 the size of the opening relative to the diameter of the sphere is such that not quite all of the hemispherical surface 20 is received within the opening. As best seen from FIG. 3, the hemispherical surface 20 engages all three of the flat or plane surfaces of the opening. The contact area at each of the three points of engagement is relatively small, however, as will be appreciated from FIG. 2, which shows only one of those contact points.

FIGS. 4 and 5 show the interengaged relationship of the mating parts 30, 40 of the second support point P2. FIG. 4 is indicated as a cross section taken on FIG. 5 while FIG. 5 is indicated as a cross section taken on FIG. 4. It will be seen that the size of opening 30 relative to the diameter of sphere 41 is such that not quite all of the hemispherical surface 40 is received within the opening. The hemispherical surface engages both of the flat or plane sloping walls of the opening. The contact areas are relatively small, as best seen from FIG. 4.

The interengaged relationship of the mating parts of the third support point P3 is shown in FIG. 6. Again, the contact area is relatively small.

In accordance with the general theory of the invention the support point P1 restricts three degrees of freedom of movement that would otherwise exist between the two rigid bodies. That is, it establishes a vertical elevation for the upper body B1 at that point; it restricts the upper body against sideways movement; and it restricts the upper body against longitudinal movement.

Also in accordance with the general theory of the invention the second support point P2 restricts two degrees of freedom of movement which the two rigid bodies would otherwise have. That is, it prevents two kinds of angular movement or rotation which the upper body might otherwise be free to undertake, one being in a vertical plane and the other in a horizontal plane.

Further in accordance with the general theory of the invention the remaining support point P3 restricts the one remaining degree of freedom of movement of the two bodies relative to each other. Specifically, it prevents rotation of the upper rigid body about a common axis 70 of the two spheres. This is accomplished by virtue of the third support point P3 being laterally displaced from the axis 70.

Some limitations or restrictions on the general concept of the invention are as follows. The trihedral pyramid 10 is preferably of symmetrical construction, that is, with its side walls being of equal size and all sloped at the same angle. The dihedral prism 30 is also preferably symmetrical, that is, with its two sloping side walls being sloped at the same angle. The length of the dihedral prism need only be sufficient to comfortably avoid having the sphere 41 engage either of its end walls. Prism 30 has a longitudinal axis 75 which is shown in FIGS. 1 and 5. The longitudinal axis of the prism is preferably aligned such that it intersects a vertical center line 80 of pyramid 10; see FIG. 1. However, some error in that regard can be tolerated.

In the present illustration both of the openings 10 and 30 are contained within the same rigid body. However, that is not a requirement in accordance with the invention. Thus, for example, the sphere 41 may be attached to the upper rigid body and the opening 30 incorporated in the lower rigid body. In general, either one of the mating parts of any of the three support points may be incorporated in either one of the rigid bodies, so long as the other mating part for that support point is incorporated in the other rigid body and appropriately located there. It is essential, however, that the location of the third support point P3 be laterally displaced from the common axis of support points P1 and P2. In other words, a tripod type of support is required.

In the preferred form of the invention the securement of the two bodies together is accomplished by gravity, by placing one body above the other and utilizing the force of gravity to maintain the mating parts at each support point in engagement. However, the invention also contemplates the application of external force at one or more of the support points in order to maintain the secured relationship of the two bodies, whenever that may prove desireable.

PREFERRED EMBODIMENT
(FIGS. 7-20)

FIGS. 7-20, inclusive, illustrate the application of the present invention in the manufacture of a product such as microminiature semiconductor electronic circuits.

In the application of the present invention to a factory layout for production of products, a series of separate work stations are utilized. At each work station there is a receiver station and a tool or device mounted on a fixed base, to perform a production step. A removable work carrier which carries a product that is being fabricated is initially positioned at one of the work stations and removably secured to the receiver. The tool or device is not shown in the present drawings. After a production step has been performed at the first work station, the work carrier is removed from that receiver, is transported to another work station, and is then removably secured to the receiver of the new station.

In carrying out production procedures in accordance with the present invention it is essential that the alignment means providing support points P1, P2 and P3 for all of the receivers are identical. Before production begins all tools are aligned to their corresponding receivers. Then a carrier bearing a work piece is positioned at each work station in sequence. Assuming that the work piece is correctly aligned to the tool at the first work station, it then necessarily follows that the work piece will also be correctly aligned to the tools at all succeeding work stations.

A work carrier constructed in accordance with the invention is shown in detail in FIGS. 8-18, inclusive, of the drawings. FIGS. 7-14, inclusive, also show the interfitting relationship between the work carrier and a first type of receiver station. FIGS. 19 and 20 show the interfitting relationship between the work carrier and two other configurations of the receiver station.

In FIG. 7, receiver stations 101 and 101a are permanently supported upon a fixed base 100, which may be a worktable or the like. The receiver station 101 and fixed base 100 together with a tool or device not specifically shown form a first work station, while receiver 101a and fixed base 100 together with a different tool or device provide a second work station. A work carrier 105, shown in dotted lines, may be supported in the first work station while a similar work carrier 105a, also shown in dotted lines, may be supported in the second work station.

FIGS. 8 and 9 show the receiver station 101 and the removable work carrier 5 in some detail, in their interengaged or operative position, the apparatus being shown in a plan view in FIG. 8 and in a side elevation view in FIG. 9. The work carrier 105 includes a flat metal plate 106 which is of generally rectangular configuration. At one end, however, the plate 106 has a central portion 106a which projects in a trapezoidal configuration. Receiver station 101 includes an essentially rectangular flat metal plate 170. It also includes an L-shaped metal bracket 171 which is rigidly secured to one side of plate 170, extends upwardly from it, and has an overhanging portion 172. The trapezoidal end portion 106a of the removable work carrier 105 is inserted between plate 170 and overhanging arm 172 of the receiver station 101. Support points P1 and P2 are provided between plate 170 and the corresponding corners of the associated end of plate 106, while support point P3 is provided between the projecting end 106a of plate 106 and the overhanging arm 172.

It will therefore be seen that in the embodiment of FIGS. 8 and 9 the work carrier 105 is supported in a cantilever arrangement from the receiver station 101. The removable carrier applies a downward force through the support points P1 and P2 to the plate 170, while an upward force is applied through point P3 to the overhanging arm 172.

In the embodiment of FIGS. 8 and 9 the interengaging parts of the support points P1, P2, P3 are arranged as follows. Removable work carrier 105 has openings for the support points P1 and P2 and has a flat surface for the support point P3. Receiver station 101 carries projecting hemispherical surfaces for all three of the support points. While other arrangements are possible, this particular arrangement is preferred because the removable work carrier 105 must be transported from one work station to another in the course of the manufacturing operations, and any projecting hemispherical surfaces that were included as a part of its self-contained structure would therefore be more easily subject to damage and increase the weight of a transported part.

Removable work carrier 105 also has structure providing an alternate third support point designated as P3′, and another alternate point designated as P3″. Support point P3′ is used in the arrangement of FIG. 19. Support point P3″ is used in the arrangement of FIG. 20.

Thus it will be seen that removable work carrier 105 has support structures providing five separate support points, while receiver station 101 has support structures providing only three support points. Each one of these eight structures includes provision for vertical adjustment. Both the plate 170 of receiver station 101 and the plate 106 of work carrier 105 are normally in horizontal positions, as illustrated in FIG. 9. Minor adjustments in elevation may be required, however, at one or more of the support points, and hence provision for such adjustment is included in all of the eight support structures.

DETAILS OF SUPPORT STRUCTURES

Each of the eight support structures includes a post which passes through an opening in the associated horizontal plate, and is vertically adjustable within that opening. A typical opening shown in FIG. 17 is the cylindrical opening 107 formed in extension 106a of the plate 106. At one point on the circumference of opening 107 a keyway 108 is formed. Similar openings with keyways are provided for all eight of the support structures.

Mechanical details at support point P1 are shown in FIGS. 11 and 13–15. A post 121 extends vertically through a keyed opening in the plate 170 of receiver station 101. A central portion 122 of post 121 has a smooth exterior surface and fits within the opening in plate 170. Central portion 122 carries a radially projecting stop 123 which occupies the keyway, thereby preventing rotation of post 121 relative to plate 170. A hexagonal lock-nut 124 threaded on the upper end of post 121 engages the upper surface of plate 170, while a similar hexagonal lock-nut 125 threaded on the lower end of the post engages the lower surface of plate 170. To change the vertical adjustment of the post one or both of the lock-nuts is loosened; the post is lifted or lowered to a desired extent; and both lock-nuts are again tightened.

On the upper end of post 121 there is formed an opening 127 that is of trihedral pyramidal configuration. See FIGS. 14 and 15. A sphere 120 fits within the opening 127. Sphere 120 has a vertical diametral opening 128 which is recessed at its upper end, and a bolt 126 whose head is adapted to receive an Allen wrench extends through that opening and hence downward beneath the sphere. A threaded opening 129 at the longitudinal axis of the upper end of post 121, constituting a downward extension of the opening 127, receives the threaded lower end of bolt 126. Securement of bolt 126 to the post 121 serves to precisely and reliably secure the sphere 120 relative to the post, so that the center of the sphere is positioned upon the longitudinal axis of the post and the position of the sphere relative to the post is reliably maintained.

Also at support point P1, a post 111 is adjustably supported from plate 106 of the removable work carrier 105. The smooth central portion 112 of post 111 is received within the opening in plate 106 and has a radially extending stop 113 that is retained by the keyway. Hexagonal lock-nuts 114, 115 are carried on the threaded upper and lower ends of the post, above and below the plate 106. The method of obtaining vertical adjustment of the post is the same as previously described.

Post 111 on its lower end has an exposed opening 110 which is in the form of a trihedral pyramid. See FIGS. 11, 13 and 15. When the work carrier 105 is supported by the receiver station 101 as shown in FIGS. 9–11, the weight of the work carrier causes post 111 to center itself above the sphere 120 such that the center of the sphere is aligned upon the longitudinal axis of the post, subject to some possible eccentricity of the pyramidal opening 110 relative to the longitudinal axis of the post.

At support point P2 the lower structure is the same as at support point P1. That is, sphere 140 supported by post 141 coincides in all respects with sphere 120 and post 121 both as to structure and as to function.

The upper part of support point P2 is of course different, in accordance with the general theory of the invention as described in conjunction with FIG. 1. A threaded post 131 is supported from plate 106 in the same manner as post 111 is supported. Its lower end, however, carries a dihedral prism 130 which receives the hemispherical upper surface of the sphere 140. See FIGS. 11, 12, 13, and 16. The weight of the work carrier causes post 131 to be restricted in two degrees of freedom by the sphere 140.

Figure 10:
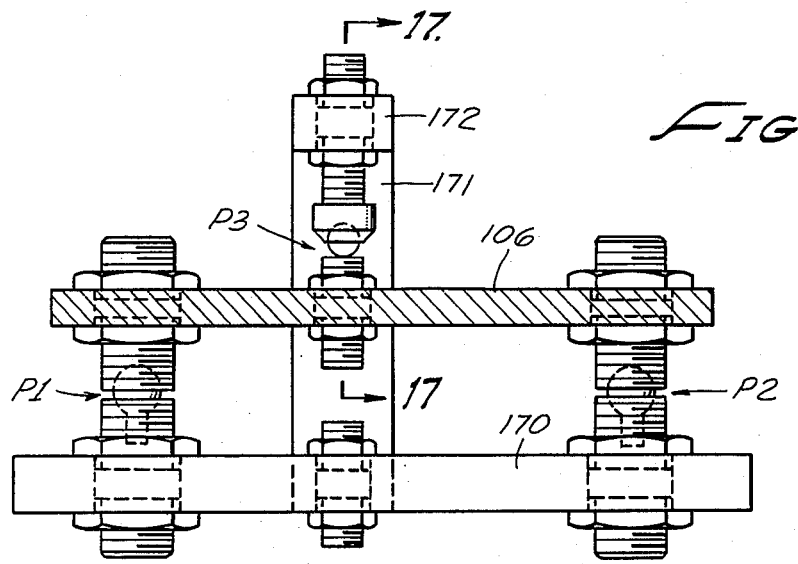
FIG. 10 is a cross-sectional elevation view of the work station of FIG. 9 taken on line 10—10 thereof.
Figure 12:
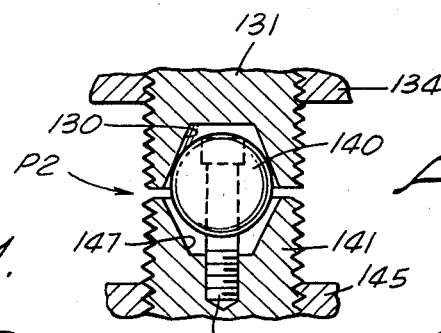
FIG. 12 is a cross-sectional elevation view of the second support point of the work station taken on line 12—12 of FIG. 11.
Figure 11:
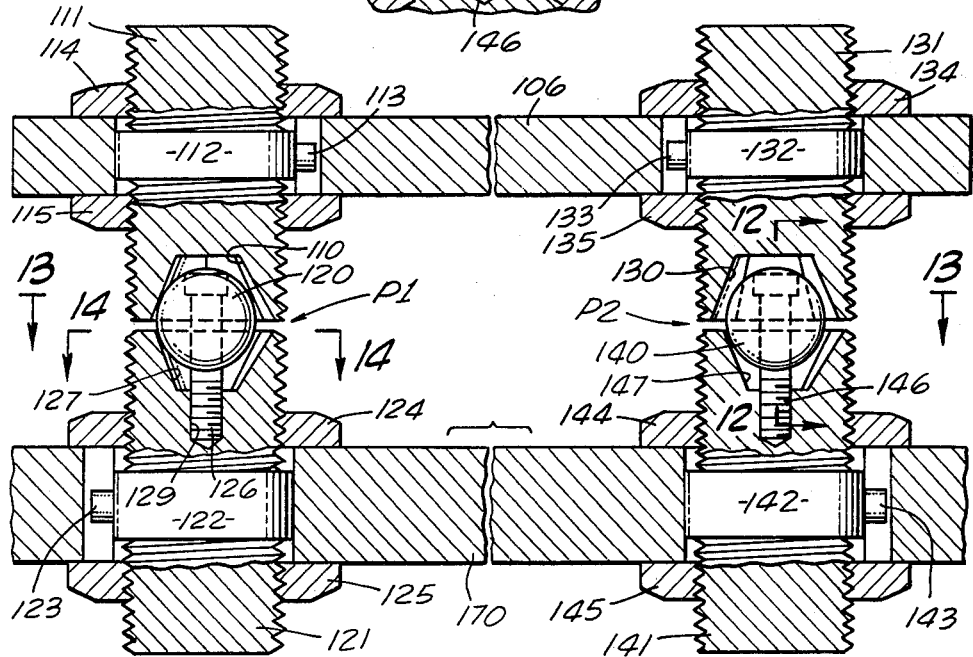
FIG. 11 is a cross-sectional elevation view of the work station of FIG. 9 taken on line 11—11 thereof.

The structure at support point P3 is shown in FIGS. 10 and 17. The lower structure includes a post 151 that is vertically adjustable relative to the plate 106, and which has a flat upper end surface 150. The upper structure includes a post 161 that is vertically adjustable in the overhanging arm 172. A special housing 166 is secured to the lower end of post 161, and a sphere 160 is loosely confined within the lower portion of that housing. The dotted line 160′ shown in FIG. 17 indicates that, when the two support structures are disengaged, the sphere 160 drops downward somewhat. Pressing the two support structures together causes the sphere to move upward to the position shown, in which its upper surface engages plane bottom surface 167 of the housing 166. When the two support structures at support point P3 come into engagement it is possible for the sphere 160 to rotate slightly in seeking its final position of rest, involving rolling friction rather than sliding friction, which insures that the structures are relieved of torque and other stresses that might adversely affect the precision of the spatial alignment. When the sphere 160 thus comes to its position of rest, it, in conjunction with the housing or retaining socket 166, provides a fixed protrusion of the rigid body 170, 172 of receiver station 101.

The use of sphere 120 at support point P1, for example, has the following advantage. The ball or sphere is made of much greater hardness than the post 121 upon which it is mounted. By known manufacturing procedures the ball or sphere can also be made much more precisely than a hemispherical surface could be formed directly upon the upper end of the post.

CONSTRUCTION OF RECEIVER STATIONS

As shown in the drawings, three different arrangements or configurations of receiver stations are utilized in the manufacture of microminiature electronic circuits. The receiver station 101 has previously been described in detail. Receiver station 101' shown in FIG. 19 also provides a cantilever type of support. However, the support points are reversed. That is, support point P3' is provided from lower plate 170' of the receiver by means of post 161' and housing 166', while support points P1 and P2 are provided from the overhanging arm 172'.

FIG. 20 shows a third configuration in the receiver station 101". There is no cantilever support of the work carrier. Plate 170" is elongated to about the same length as plate 106 of the work carrier. Support points P1 and P2 are provided at one end of plate 170", while support point P3" is provided at its other end by means of the post 161" and housing 166".

Althouth it is possible to use different configurations of the receiver station, their alignment means must be made as precisely identical as possible. Specifically, the support structures for support points P1 and P2 must provide the same two points in space, and having the same distance between them. Where the receiver incorporates the hemispherical surfaces, as is preferred, the radii of those surfaces must be identical and the distance between their centers must also be identical.

In particular, the hemispherical surfaces 120 and 140 must be of the same diameter in every receiver station, and must have the same distance between centers. This relationship ensures that regardless of which receiver station is presently supporting a particular work carrier, the hemispherical surface 120 engages the same three small contact areas in opening 110 while the hemispherical surface 140 engages the same two small contact areas in opening 130.

It is also essential that for all receiver stations having a particular configuration the support point P3 provide the same plane relative to the common axis of support points P1 and P2. Specifically, the location of housing 166 and sphere 160 relative to the common axis of the hemispherical surfaces 120, 140 is made identical, or as nearly so as possible.

In constructing the receiver the openings 107 for posts 121 and 141 are drilled in metal plate 170 by a precision method. Each post is initially made oversize. The trihedral pyramidal opening is formed in its upper end, as well as the threaded central extension thereof. Each of the spheres 120, 140 is bolted to its corresponding post. Then each post is machined to size, using the sphere to establish its center line.

CONSTRUCTION OF WORK CARRIER

Work carrier 105 includes plate 106 carrying adjustable posts 111, 131 that respectively provide opening 110 for support point P1 and opening 130 for support point P2. These openings are used in conjunction with all three of the receiver configurations. Adjustable post 151, FIG. 17, provides flat surface 150 for support point P3 in conjunction with the receiver of FIGS. 7–18.

Also included in work carrier 105 is the post 151' located on the interior side of posts 111, 131, see FIGS. 9 and 19. This is used in conjunction with the receiver configuration of FIG. 19, where the carrier is inverted.

The work carrier additionally includes an adjustable post 151" which is on the opposite end of plate 106 and provides a flat surface 150" which faces downwardly. This is used in conjunction with the receiver configuration of FIG. 20.

WORK HOLDER

As best shown in FIGS. 8 and 9, a substrate 190 consitituting a work piece from which microminiature electronic circuits are to be formed is securely fastened to the upper surface of a work holder 180. Work holder 180 is essentially in the form of a flat plate which is in turn positioned upon the upper surface of plate 106 of work carrier 105. The work holder 180 has holes 181 on its ends which receive bolts 182 for securing the work holder to plate 106. See FIGS. 8, 9 and 10. Each hole is sufficiently large to permit lateral adjustment of the work holder 180. Hence, upon loosening both of the bolts 182, the work holder 180 may be adjusted in a parallel plane relative to its supporting plate 106.

THE PRODUCTION PROCESS; ALIGNMENT AND CALIBRATION

In order to carry out a production process in accordance with the present invention a series of work stations are provided. Each work station includes a receiver station secured on a fixed base, as well as an associated tool or device for performing a particular production step.

A large number of work carriers are also required for producing the part that is to be manufactured. While the number of work stations is relatively few, there may be a vast number of the production work carriers. In addition to the production work carriers there is one particular work carrier that is selected as a master or pattern. It is constructed in the same manner as the other work carriers.

It will be seen that the total set of apparatus provides for many possible adjustments. Specifically, in each receiver station all three of the support points P1, P2, P3 may be adjusted vertically so as to establish a desired frame of reference. Each work carrier also has three vertical adjustments corresponding to the support points P1, P2, P3. Further, the work holder 180 may be adjusted laterally, longitudinally, or angularly relative to the work carrier upon which it is supported.

The procedure is briefly summarized as follows. The first step is to employ the master work carrier for aligning the receivers of all of the work stations. As a second step the tool or device of each work station is aligned with the frame of reference of its associated receiver, and again, the master carrier is used in achieving this result. The third step is to adjust all of the production work carriers so that they all conform to the master carrier. This is accomplished by positioning each of the work carriers in sequence at a particular work station. The final step when commencing production on a particular work piece is to orient that work piece relative to its work carrier. This is accomplished at one particular work station, and no further adjustment is needed as the work piece progresses through the succeeding work stations.

Alignment of the receivers is accomplished as follows. A distinguishing feature of the master carrier is that its vertical adjustments of the support points P1, P2, P3 have been established and will not subsequently be modified. The master work carrier is not equipped with a work holder or work piece, but it is equipped with suitable means for indicating position alignment, such as, for example, an optical reference grid secured to the surface of plate 106. The master work carrier is inserted into the receiver of the first work station. The receiver posts 121, 141, and 161 are vertically adjusted as necessary in order to provide the desired elevation and desired angle of inclination of the master carrier. For example, it may be desired that the master carrier be so positioned that the upper flat surface of plate 106 is precisely horizontal. It is preferred that the vertical positions of the posts 121, 141 should not differ substantially from each other because that would make some change in the horizontal distance between the points P1 and P2 in the frame of reference established by the receiver. After the receiver of the first work station is aligned, the master carrier is moved through all of the other work stations in sequence, and each of the other receivers is also aligned in the same manner.

Alignment of the tools is accomplished as follows. After the receiver of the first work station has been aligned, it supports the master carrier in the desired position. Then the tool, photomask, or other production device of the first work station is adjusted so as to be in its desired position relative to the master work carrier. The master carrier is then moved to each of the other work stations in succession, and the tool or device for each work station is aligned in the same manner.

If desired, the master carrier may first be used for aligning the receivers of all of the work stations, and then subsequently used for aligning the tools in all of the work stations. Alternatively, however, when the master carrier is inserted in the first work station the alignment of both the receiver and the tool may be completed before the master carrier is moved. Then at each succeeding work station the master carrier is used to align both the receiver and the tool or device of that work station, before moving to the next station.

The purpose of adjusting the production work carriers is to make the vertical adjustments of their support points P1, P2, P3 conform precisely to those in the master carrier or pattern. This is accomplished at a single work station. Special instrumentation which is used at that work station for aligning the work carriers does not have to be moved from one place to another. One of the production work carriers is inserted in the work station and its support points adjusted to the desired position. Then it is removed and another work carrier is installed and adjusted. Then all of the other production work carriers are adjusted at the same work station.

After all of the production work carriers have been adjusted it is still necessary, however, to orient each work piece relative to the work carrier upon which it is to be transported. This orientation is done within the adjustment capabilities of the work holder 180. The work piece is oriented at the very first work station, and then at the subsequent work stations it is not necessary to alter the position of adjustment of the work holder 180.

More specifically, in accordance with the general concept of the invention the first work station is equipped only with instrumentation that is used for orienting the work piece, and is not equipped with any other tool or device for performing a production step per se. Thus the number of work stations must be equal to the number of production steps to be performed plus one. For example, if there are ten separate production steps to be performed upon the work piece, there must be eleven work stations because the first work station is used only for orienting the work piece relative to its work carrier.

However, in the production of microminiature semiconductor circuits from a substrate such as the substrate 190, it is possible to omit the step of orienting the work piece at the first work station. This result can be accomplished by making the substrate 190 considerably larger than actually required. Then the portion of the substrate that is actually used will lie well within its borders, and when all production steps are completed there is a remaining fringe portion of the substrate which may be scrapped or re-cycled. In these particular circumstances, then, only ten work stations are required for performing a series of ten production steps.

In the production process a particular work piece transported on a particular work carrier is supported at the first work station. If orientation of the work piece is required, that is accomplished here, and otherwise the first production step is performed here. The production step may, for example, consist of drilling a hole, or of performing a photolithographic process step. Then the work carrier is removed from the first work station and inserted into the second work station. No adjustments need be made at the second work station in either the work carrier or the work station. A production step is then performed at the second work station. In similar fashion the work carrier is quickly snapped out of the second work station and just as quickly snapped into the third work station, where another production work step is performed. This process is continued until the work piece has passed through all of the work stations. The handling of the work piece during the production process may be accomplished by relatively unskilled and relatively untrained workers, since they are neither required nor permitted to change the adjustments or alignment of the various pieces of equipment. If orientation of the work piece at the first work station is required, then it may be necessary to have a more skilled person perform that task.

In accordance with the invention it is desired that all receivers be made as nearly identical as possible, and particularly in respect to the hemispherical surfaces 120 and 140, the distance between the centers of the hemispheres, and the plane established by the surface 150 in conjunction with the common axis of the hemispheres. That is to say, all receivers should establish an identical frame of reference. Of course it is true that in different configurations of the receiver the plane established by surface 150 will differ. High precision in the fabrication of the receivers is therefore required.

But in making the production work carriers high precision is not required. The reason is that the same six small contact areas of the work carrier will be engaged by the receiver, regardless of the work station at which the work carrier is located. In view of the vast number of work carriers that are needed, the acceptability of low precision is of great practical importance.

As the production process is continued, a number of workers may be employed which is equal to or greater than the work stations. It may be desired to have a particular worker process a particular work piece through all of the work stations. Alternatively, it may be desired to have a particular worker permanently stationed at a particular work station. But in any event, the snap-fitting relationship of the work carrier and receiver station of the present invention makes it possible to position each work piece at each work station almost instantly, in its proper alignment, and also to remove it almost instantly when the work on it to be done at that work station has been completed.

The invention has been described in considerable detail in order to comply with the patent laws by providing a full public disclosure of at least one of its forms. However, such detailed description is not intended in any way to limit the broad features or principles of the invention, or the scope of patent monopoly to be granted.

What is claimed is:

1. A system for removably securing two rigid bodies together at three support points in a fixed and predetermined spatial relationship so that they can be quickly and easily separated and then secured together again in precisely the original relationship, said system comprising:
    a first body having first and second exposed openings, said first opening being in the form of a trihedral pyramid with its widest dimension at the outward end, and said second opening being in the form of dihedral prism with its widest dimension at the outward end;
    said dihedral prism of said second opening having a longitudinal axis which extends toward said first opening;
    said first body also having an exposed supporting surface which lies outside an axis common to said first and second openings;
    a second body having first and second protruding hemispheres which are so spaced as to be received by said first and second openings, respectively, of said first body; and
    said second body also having a protrusion adapted to engage said exposed surface of said first body.

2. The apparatus of claim 1 wherein said second body is a receiver station mounted on a fixed base, said first body is a removable work carrier, and said three support points are so arranged that said work carrier may be positioned above said receiver station and supported thereon by gravity.

3. Apparatus according to claim 1 wherein said protrusion has a convexly curved end for engaging said exposed surface.

4. Apparatus according to claim 1 wherein said protrusion is a rigid sphere held in loose confinement in a retaining socket on said second rigid body.

5. Apparatus as in claim 1 wherein said first body includes means for adjusting the position of one of said exposed openings relative to the remainder of said body.

6. Apparatus as in claim 5 wherein said first body is essentially in the form of a flat plate having transverse openings receiving a corresponding pair of posts, said exposed openings being formed in the ends of said posts, and said posts being adjustable in said transverse openings in a perpendicular direction relative to said plate so as to permit adjustment of the positions of said exposed openings.

7. A system for removably securing two rigid bodies together at three support points such that the bodies can be quickly and easily separated and then secured together again in precisely their original relationship, said system including the two bodies which cooperatively provide the three support points, the system being characterized in that:
    at a first support point, one body has an exposed opening in the form of a trihedral pyramid with its widest dimension at the outward end thereof and the other body has a protruding hemisphere adapted to be received within said opening in engagement with all three plane surfaces thereof;
    at a second support point, one body has an opening in the form of a dihedral prism with its widest dimension at the outward end thereof and the other body has a protruding hemisphere adapted to be received within said opening in engagement with both plane surfaces thereof, the longitudinal axis of said prism extending toward said first support point; and
    at the third support point, one body has a protrusion which lies outside an axis common to said first and second support points, and the other body has an exposed supporting surface adapted to be engaged by said protrusion in substantially perpendicular relation thereto.

8. The apparatus of claim 7 wherein one of said bodies is a receiver station mounted on a fixed base, both of said hemispheres are on said receiver station, the other body is a removable work carrier, and said three support points are so arranged that said work carrier may be positioned above said receiver station and supported thereon by gravity.

9. Apparatus according to claim 7 wherein said protrusion has a convexly curved end for engaging said exposed surface.

10. Apparatus according to claim 7 wherein said protrusion is a rigid sphere held in loose confinement in a retaining socket on the associated rigid body.

11. Apparatus as in claim 7 wherein one of said bodies includes means for adjusting the position of an exposed opening carried by said body, relative to the remainder of said body.

12. Apparatus as in claim 7 wherein one of said bodies is essentially in the form of a flat plate having a transverse opening adapted to receive a post;
    which further includes an elongated post having an exposed opening formed in its outer end, the inner end of said post being disposed within said transverse opening;
    and said post being axially adjustable in said transverse opening so as to permit adjustment of the position of the associated exposed opening relative to said plate.

13. In a system for removably securing two rigid bodies together in precisely predetermined relation to each other, an improved construction for a point of attachment of the two bodies, comprising, in combination:
    a first rigid body having an exposed opening in the form of a trihedral pyramid, the widest dimension being on its outward end;
    a second rigid body having an exposed opening in the form of a trihedral pyramid, the widest dimension being on its outward end, said second body also having a threaded opening formed as an extension of the inner end of said exposed opening;
    a rigid sphere of such diameter that it may occupy the outer ends of both of said openings at the same time, but with less than half the volume of said sphere being received within each of said openings, said sphere having a passageway therethrough which passes through the center thereof and is recessed on one end; and
    a bolt having a head received in said recessed end of said passageway and a shank extending through said passageway, said shank having a protruding end which is threaded and is adapted to be received in said threaded opening of said second rigid body;

said sphere being received in said exposed opening of said second rigid body and said bolt being tightened in said threaded opening so as to secure said sphere in firm engagement with all three plane walls of said exposed opening of said second rigid body;

whereby when said two bodies are pressed together each of them assumes a precisely predetermined position relative to the center of said sphere.

14. Apparatus for the assembly line manufacture of microminiature electronic circuits, said apparatus comprising, in combination:

a fixed base;

a receiver station supported from said fixed base, said receiver station including a rigid body having two hemispherical surfaces protruding upwardly therefrom and also having a fixed projection which is laterally displaced from an axis common to the radius centers of said two hemispherical surfaces;

a removable work carrier having generally the form of a rectangular flat plate with two exposed openings in its under surface, one of said openings having the form of a trihedral pyramid and the other having the form of a dihedral prism, said work carrier being disposed above said receiver station with said hemispherical surfaces being received within corresponding ones of said openings in supporting engagement with the sloping side walls thereof;

said work carrier also having a flat surface adapted to be supportingly engaged by said fixed projection whereby said receiver station supports said work carrier at three support points;

separate means associated with one of said support points for adjusting the elevation of said work carrier relative to said receiver;

a work holder positioned on the upper surface of said work carrier and having an upper surface adapted to receive and support a substrate from which microminiature circuits are to be manufactured; and means for adjusting the horizontal position of said work holder relative to said work carrier.

* * * * *